United States Patent
Chang

(10) Patent No.: US 9,433,050 B2
(45) Date of Patent: Aug. 30, 2016

(54) MICRO-LIGHT-EMITTING DIODE

(71) Applicant: MIKRO MESA TECHNOLOGY CO., LTD., Apia (WS)

(72) Inventor: Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/510,097

(22) Filed: Oct. 8, 2014

(65) Prior Publication Data
US 2016/0104818 A1    Apr. 14, 2016

(51) Int. Cl.
*G01R 31/26* (2014.01)
*H05B 33/08* (2006.01)
*H01L 33/38* (2010.01)

(52) U.S. Cl.
CPC ........... *H05B 33/0845* (2013.01); *H01L 33/38* (2013.01); *H01L 2933/0016* (2013.01)

(58) Field of Classification Search
CPC ............... H01L 33/387; H01L 33/005; H01L 33/0845; H01L 2933/0016
See application file for complete search history.

(56) References Cited

U.S. PATENT DOCUMENTS 6,410,942 B1 *   6/2002   Thibeault et al. ............. 257/88
2015/0060934 A1 *   3/2015   Yoneda et al. ................. 257/99

\* cited by examiner

*Primary Examiner* — Shaun Campbell
(74) *Attorney, Agent, or Firm* — CKC & Partners Co., Ltd.

(57) ABSTRACT

A micro-light-emitting diode (micro-LED) includes a first type semiconductor layer, a second type semiconductor layer, a dielectric layer, and electrodes. The second type semiconductor layer is disposed on or above the first type semiconductor layer. The dielectric layer is disposed on the second type semiconductor layer. The dielectric layer includes openings therein to expose parts of the second type semiconductor layer. The electrodes partially are disposed on the dielectric layer and respectively electrically coupled with the exposed parts of the second type semiconductor layer through the openings of the dielectric layer, in which the electrodes are separated from each other.

6 Claims, 11 Drawing Sheets

MICRO-LIGHT-EMITTING DIODE

BACKGROUND

1. Technical Field

The present disclosure relates to micro-light-emitting diodes (micro-LEDs).

2. Description of Related Art

Electronic devices increasingly include display screens as part of the user interface of the device. As may be appreciated, display screens may be employed in a wide array of devices, including notebook computers and handheld devices, as well as various consumer products, such as smart phones and tablet personal computers. Some of those devices result in the screen display being used under a variety of environmental conditions. One example is having a display screen mounted within an automobile. A driver's or passenger's ability to view the screen while traveling in a vehicle is affected by the outside light conditions, for example. Different levels of screen brightness are required during daytime hours as compared to nighttime hours. Accordingly, there is a need for an efficient and relatively simple way of adjusting the brightness of a display screen in response to ambient light conditions.

In the recent years, light-emitting diodes (LEDs) have become popular in general and commercial lighting applications. Accordingly, since the screen displays are used under a variety of environmental conditions, high ambient light conditions or low ambient light conditions, a wider dynamic range of the LEDs brightness output becomes important in display screens.

However, in the current density versus voltage (J-V) characteristics of an LED, current density is approximately an exponential function of voltage near the threshold, so a small voltage change may result in a large change in current density. Further, the I-V characteristics is determined by the following equation I:

$$I = I_0 \left( \exp\left(\frac{q(V - Ir_s)}{nKT}\right) - 1 \right) \qquad \text{equation I}$$

where I is the current through the LED, $I_0$ is the maximum current for a large reverse bias voltage (reverse saturation current), q is the electron charge, V is the voltage across the diode, $r_s$ is the series resistance, k is Boltzmann's constant, and T is the absolute temperature.

In addition, one disadvantage of the conventional LEDs is that the LEDs have a wide range of operating current density, and the J-V curve of the LEDs is nonlinear as the current density is too low or too high. When the current density is too low, the forward voltage of each of the LEDs is different from others due to the difference produced by the manufacture process, and hence the brightness uniformity of the LEDs is difficult to control. When the current density is too high, the conversion efficiency of the LEDs is low due to the thermal issue.

Furthermore, if the voltage is below the threshold or on-voltage no current will flow and the result is an unlit LED. If the current density is too high the current will go above the maximum rating, the result is overheating and potentially destroying the LED. Therefore, the LED brightness is difficult to be controlled linearly due to the above reason.

SUMMARY

According to one embodiment of this invention, a micro-light-emitting diode (micro-LED) includes a first type semiconductor layer, a second type semiconductor layer, a dielectric layer, and electrodes. The second type semiconductor layer is disposed on or above the first type semiconductor layer. The dielectric layer is disposed on the second type semiconductor layer. The dielectric layer includes openings therein to expose parts of the second type semiconductor layer. The electrodes partially are disposed on the dielectric layer and respectively electrically coupled with the exposed parts of the second type semiconductor layer through the openings of the dielectric layer, in which the electrodes are separated from each other.

DETAILED DESCRIPTION

Figure 1:
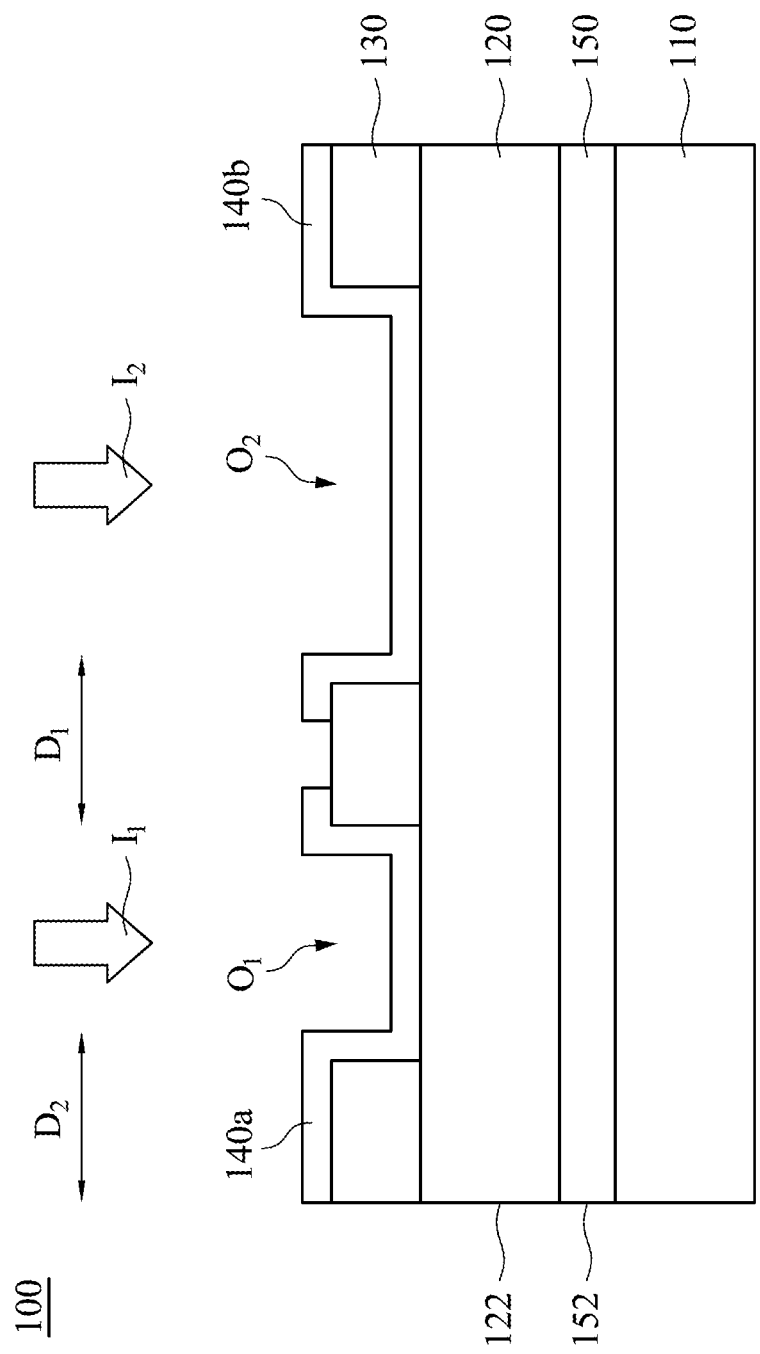
FIG. 1 is a cross-sectional view of a micro-light-emitting diode (micro-LED) according to the first embodiment of this invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a cross-sectional view of a micro-light-emitting diode (micro-LED) 100 according to the first embodiment of this invention. The micro-LED 100 includes a first type semiconductor layer 110, an active layer 150, a second type semiconductor layer 120, a dielectric layer 130, a first electrode 140a, and a second electrode 140b. The second type semiconductor layer 120 is disposed above the first type semiconductor layer 110. The active layer 150 is disposed between the first type semiconductor layer 110 and the second type semiconductor layer 120. The dielectric layer 130 is disposed on the second type semiconductor layer 120. The dielectric layer 130 has a first opening O1 and a second opening O2 therein to expose parts of the second type semiconductor layer 120. The first electrode 140a and the second electrode 140b are partially disposed on the dielectric layer 130 and are electrically coupled with the exposed parts of the second type semiconductor layer 120 through the first opening O1 and the second opening O2, respectively, in which the first electrode 140a and the second electrode 140b are separated from each other.

By the aforementioned configuration, electric potential of the first electrode 140a and the second electrode 140b can be individually controlled, such that current I1 and current I2 which are independent of each other are respectively generated. The current I1 flows along a path from the first electrode 140a to the active layer 150 through the first opening O1 and the second type semiconductor layer 120, and the current I2 flows along another path from the second electrode 140b to the active layer 150 through the second opening O2 and the second type semiconductor layer 120. Since the brightness of the micro-LED 100 is proportional to intensity of the current flowing through the micro-LED 100, individually controlling the electric potential of the electrode 140a and the second electrode 140b for generating independent currents varies the brightness of the micro-LED 100.

For example, one of the current I1 and the current I2 flows through the micro-LED 100 to provide low brightness. On the contrary, the current I1 and the current I2 flow through the micro-LED 100 simultaneously to provide high brightness. By controlling the number of the electrodes and openings with the current flowing, the total current flowing the micro-LED 100 and the brightness of the micro-LED 100 are correspondingly varied.

Further, individually controlling the electric potential of the first electrode 140a and the second electrode 140b includes controlling the potential difference between the electrodes, including the first electrode 140a and the second electrode 140b, and the first type semiconductor layer 110. For example, when the electric potential of the first electrode 140a is controlled to be V1, the electric potential of the second electrode 140b is controlled to be V2, the electric potential of the first type semiconductor layer 110 is V3, and V1≠V2=V3 (for example, V1>V2=V3), only the current I1 is generated. Similarly, when V2≠V1=V3 (for example, V2>V1=V3), only the current I2 is generated. Furthermore, when V1=V2≠V3 (for example, V1=V2>V3), the current I1 and the current I2 are generated simultaneously.

In addition, the first opening O1 and the second opening O2 have different areas, in which the first opening O1 has an area A1 and the second opening O2 has an area A2, and A2>A1. Therefore, when the micro-LED 100 is operated within a linear current density range from J1 to J2, the first opening O1 with the area A1 and the second opening O2 with the area A2 are dimensioned to allow the current flowing through the micro-LED 100 to be controlled within a continuous current range from A1*J1 to (A1+A2)*J2.

Figure 2:
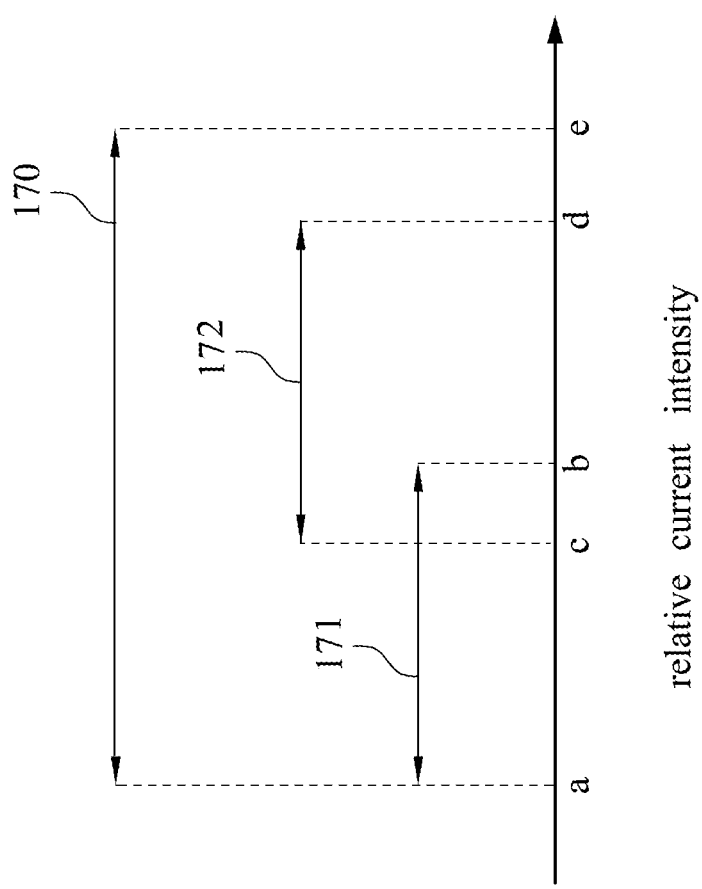
FIG. 2 is a continuous current range of the micro-LED of FIG. 1.

FIG. 2 is a continuous current range of the micro-LED of FIG. 1. The horizontal axis of FIG. 2 is the relative current intensity. As shown in FIG. 1 and FIG. 2, the total current flowing through the micro-LED 100, the current I1, and the current I2 are marked as ranges 170, 171, and 172, respectively.

In some embodiments, the current I1 is in a range from A1*J1 to A1*J2 (the range 171 from a to b in FIG. 2), the current I2 is in a range from A2*J1 to A2*J2 (the range 172 from c to d in FIG. 2), and A1*J2>A2*J1, such that the ranges 171 and 172 of the current I1 and the current I2 are overlapped. Since the total current flowing through the micro-LED 100 is superposed by the current I1 and the current I2, the range 170 (from a to e in FIG. 2) of total current flowing through the micro-LED 100 superposed by the ranges 171 and 172, which are overlapped, is continuous. Therefore, the current range of the micro-LED 100 is continuous. In addition, since the range 170 is superposed by the ranges 171 and 172, the length of the range 170, from a to e, is the sum of the length of the ranges 171 and 172, from a to b and from c to d, respectively.

Similarly, since the current flowing through the micro-LED 100 is controlled within the continuous current range from A1*J1 to (A1+A2)*J2, the brightness of the micro-LED 100 is proportional to the continuous current range from A1*J1 to (A1+A2)*J2. In other words, the brightness of the micro-LED 100 is continuous and is controlled in a range, which is dependent on the dimension of the first opening O1 and the second opening O2 and the current density J1 and J2.

Figure 3:
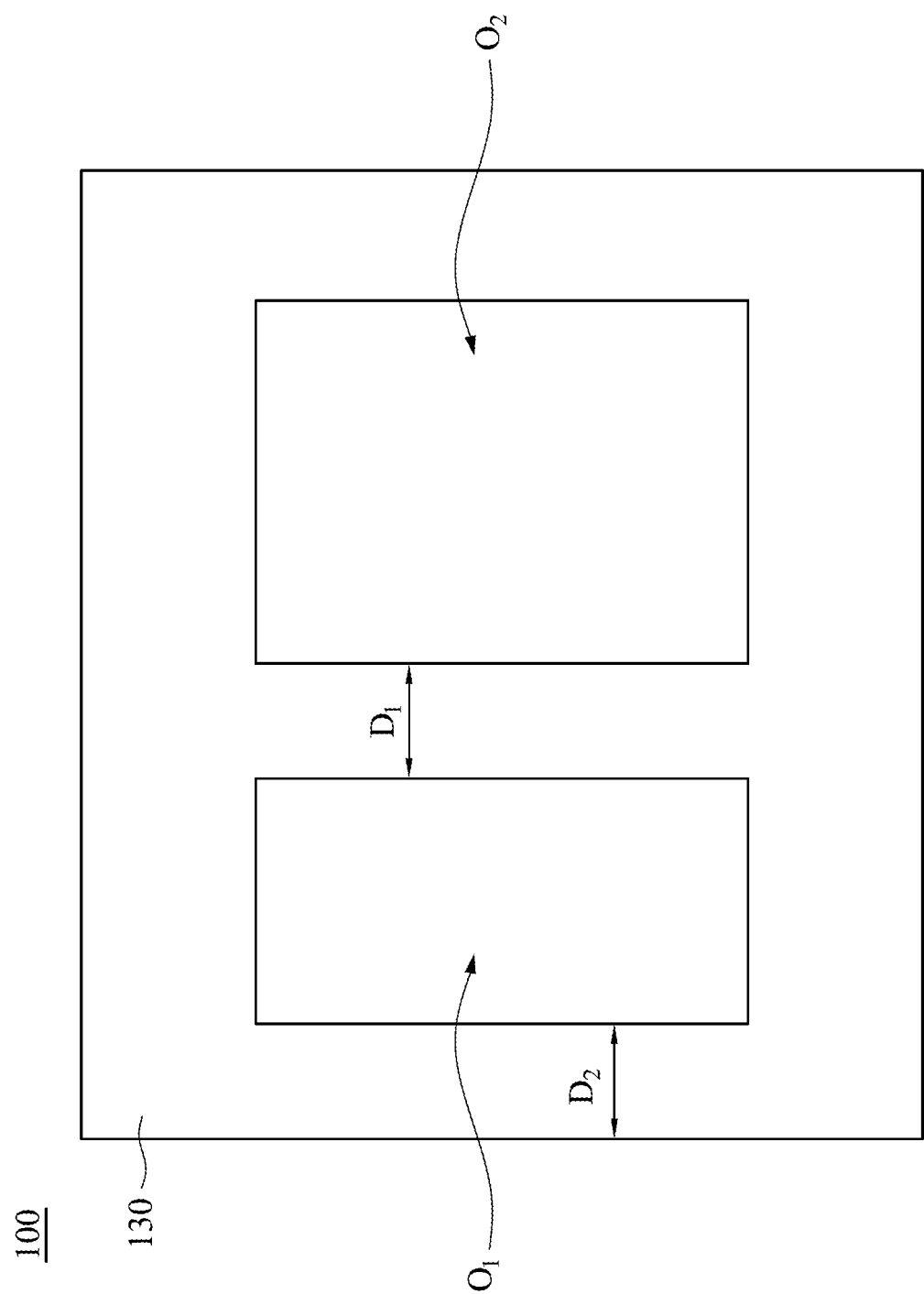
FIG. 3 is a plan view of the micro-LED of FIG. 1, wherein the electrodes are removed.

FIG. 3 is a plan view of the micro-LED 100 of FIG. 1, wherein the electrodes are removed. As shown in FIG. 1 and FIG. 3, the first opening O1 and the second opening O2 are substantially the same. Therefore, the following description is taking the first opening O1 as an example, and the structural details of the second opening O2 are similar to that of the first opening O1.

The first opening O1 defines the contact interface between the first electrode 140a and the second type semiconductor layer 120. When the micro-LED 100 is forward biased, charge carriers (or current) flow from the contact interface between the first electrode 140a and the second type semiconductor layer 120 to the active layer 150.

In some embodiments, a second shortest distance D2 between an edge of the first opening O1 and a side surface 122 of the second type semiconductor layer 120 is greater than or equal to 1 µm. Since the second shortest distance D2 is greater than or equal to 1 µm, charge carriers spreading to the side surface 122 and/or a side surface 152 of the active area 150 are rare or none. Therefore, the non-radiative recombination occurring at the side surface 152 can be reduced, thereby increasing the efficiency of the micro-LED 100.

Furthermore, since the first opening O1 limits the area where the current goes into the micro-LED 100, the current density within the emitting area of the micro-LED 100 increases and can be uniform, thereby increasing the efficiency of the micro-LED 100.

Moreover, since charge carriers spreading to the side surface 122 and/or the side surface 152 are rare or none, the leakage currents of the micro-LED 100 can be reduced regardless of the lattice defects in the side surface 122 and/or the side surface 152.

Furthermore, since the first opening O1 makes the emitting area of the micro-LED 100 smaller than the size of the micro-LED 100, it is possible to continue miniaturization of the emitting area of the micro-LED 100 while remain the size of the micro-LED 100 to allow the micro-LED 100 to be manufactured with acceptable yield rate. For example, a 20 µm×20 µm micro-LED 100 with a 2 µm×2 µm opening can perform the same light output characteristics as a 2 µm×2 µm micro-LED. In addition, the micro-LED 100 with a larger size has a considerably lower electrostatic sensitivity, a considerably lower surface leakage current, and a considerably lower side surface leakage current due to the lattice defects. In some embodiments, the size of the micro-LED 100 is smaller than 100 µm×100 µm or 0.01 mm².

In some embodiments, a geometric weighted mean distance between the edge of the first opening O1 and the side surface 122 is greater than or equal to 1 µm. Similarly, since the geometric weighted mean distance between the edge of the first opening O1 and the side surface 122 is greater than or equal to 1 μm, charge carriers spreading to the side surface 122 and/or a side surface 152 of the active area 150 are rare or none.

Further, the total area of the openings of the dielectric layer 130 viewed in a direction normal to the dielectric layer 130 occupies 1%-95% of the total area of the micro-LED 100 viewed in the direction normal to the dielectric layer 130. If the total area of the openings occupies less than 1% of the total area of the dielectric layer 130, at least one of the openings may be too small, and therefore a complex photolithography process may be needed. If the total area of the openings occupies greater than 95% of the total area of the dielectric layer 130, the second shortest distance D2 may be less than 1 μm, thereby allowing charge carriers to spread to the side surface 122 and/or the side surface 152.

In some embodiments, a first shortest distance D1 between the first opening O1 and the second opening O2, which are adjacent openings, is greater than or equal to 0.5 μm. Since the first shortest distance D1 is greater than or equal to 0.5 μm, the paths of the current I1 and the current I2 are separated by a space. Therefore, the paths of the current I1 and the current I2 keep independent of each other.

In addition, the first opening O1 and the second opening O2 in this embodiment have different areas, but are not limited thereto. For example, in some embodiments, the first opening O1 has an area A1, the second opening O2 has an area A2, and A1≤A2. That is, all the openings of the dielectric layer 130 have the same shape or have different shapes.

Figure 4:
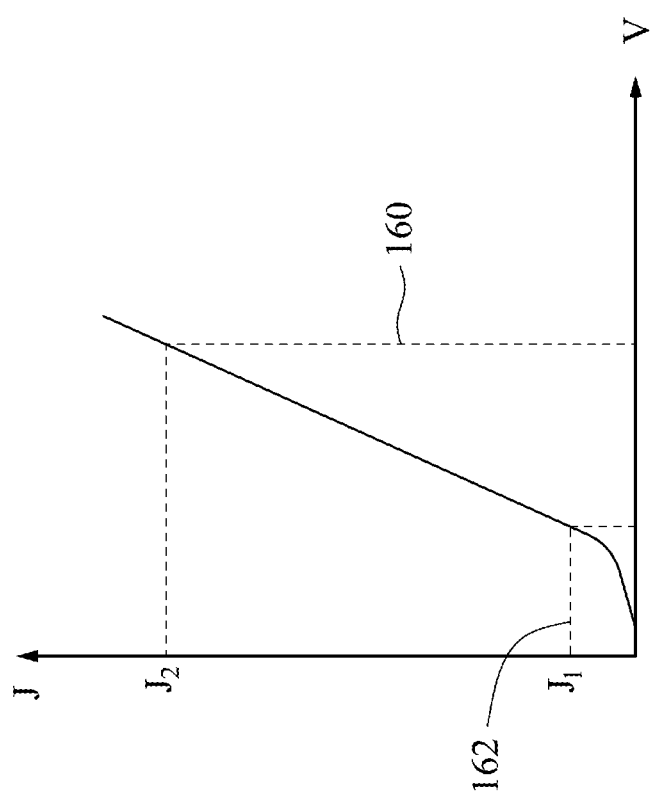
FIG. 4 is a current density-voltage curve of a micro-LED.

FIG. 4 is a current density-voltage curve of a micro-LED. During operating a micro-LED, the J-V curve is approximately regarded as two regions, in which one region is a linear region 160 and the other one is a nonlinear region 162. In the linear region 160, when the voltage is increased, the current density from J1 to J2 is increased linearly. In the nonlinear region 162, when the voltage is increased, the current density below J1 is increased substantially at the threshold. In other words, the current density of the micro-LED in the linear region 160 from J1 to J2 is easier and steadier to be controlled than in the nonlinear region 162.

As shown in FIG. 3 and FIG. 4, in some embodiments, the first opening O1 and the second opening O2 of the dielectric layer 130 are dimensioned to allow the micro-LED 100 to be operated in a linear region 160 of the J-V curve. For example, assuming current for driving the micro-LED 100 is set at 10 μA, a 50 μm×50 μm micro-LED and a 50 μm×50 μm micro-LED with a 100 μm² total area of openings are compared in the following. In the 50 μm×50 μm micro-LED, the corresponding current density is calculated as 0.4 A/cm² (10*10⁻⁶/50*50*10⁻⁸). In the 50 μm×50 μm micro-LED with the 100 μm² total area of the openings, the corresponding current density is calculated as 10 A/cm² (10*10⁻⁶/100*10⁻⁸). Since the micro-LED with the openings has the greater current density under the same current, the micro-LED with the openings is easier and steadier to be controlled than the micro-LED without openings due to avoiding near the threshold. Therefore, with this characteristic, the current flowing through the micro-LED 100 in the range from A1*J1 to (A1+A2)*J2 can be controlled steadily.

Reference is made back to FIG. 1. In some embodiments, the current spreading length of the second type semiconductor layer 120 is less than the current spreading length of the first type semiconductor layer 110. That is, the current spreading length of the first type semiconductor layer 110 is greater than the current spreading length of the second type semiconductor layer 120. In some embodiments, the current spreading length of the first type semiconductor layer 110 is over 20 times greater than the current spreading length of the second type semiconductor layer 120. In this configuration, charge carriers in the second type semiconductor layer 120 are more difficult to spread to the side surface 122 and/or the side surface 152. Therefore, the non-radiative recombination occurring at the side surface 152 can be further reduced, thereby further increasing the efficiency of the micro-LED 100.

The current spreading length of a semiconductor layer of a diode is determined by the following equation II:

$$L_s = \sqrt{\frac{m_{ideal}KT}{\rho J_0 e}} \quad \text{Equation II}$$

where $L_s$ is the current spreading length of the semiconductor layer of the diode, t is the thickness of the semiconductor layer, $n_{ideal}$ is the ideality factor of the diode, K is the Boltzmann constant, T is the temperature of the semiconductor layer in Kelvin, $\rho$ is the resistance of the semiconductor layer, $J_0$ is the current density at the interface between the semiconductor layer and a electrode of the diode, and e is the charge of a proton.

As confirmed by the aforementioned equation I, the current spreading length of the semiconductor layer of the diode is proportional to $$\sqrt{\frac{t}{\rho}}.$$

Therefore, in some embodiments, the first type semiconductor layer 110 has a resistance $\rho_1$ and a thickness $t_1$, the second type semiconductor layer 120 has a resistance $\rho_2$ and a thickness $t_2$, and $$\sqrt{\frac{t_2}{\rho_2}} < \sqrt{\frac{t_1}{\rho_1}}$$

to make the current spreading length of the second type semiconductor layer 120 to be less than the current spreading length of the first type semiconductor layer 110. In some embodiments, the first type semiconductor layer 110 is an n type semiconductor layer, and the second type semiconductor layer 120 is a p type semiconductor layer.

In addition, the IV curve for a micro-LED may have a steep slope of the forward current versus the forward voltage especially in the mid/low power region near the threshold. This steep slope makes it difficult to control the forward current, and thus the brightness of the micro-LED cannot be easily controlled.

Therefore, in some embodiments, the dielectric layer 130 with the openings is disposed on the second type semiconductor layer 120, which has a short current spreading length. Since the second type semiconductor layer 120 has the short current spreading length, the second type semiconductor layer 120 has high resistance and is thin in thickness. In this configuration, the serial resistance of the micro-LED 100 increases, thereby making the slope of the forward current versus the forward voltage gentle. This gentle slope makes it easier to control the forward current, and thus the brightness of the micro-LED 100 can be more easily controlled.

In some embodiments, the first type semiconductor layer 110 is made of, for example, n-doped GaN:Si. The thickness of the first type semiconductor layer 110 is in a range from 0.1 µm to 50 µm. The first type semiconductor layer 110 is formed by, for example, epitaxy.

In some embodiments, the second type semiconductor layer 120 is made of, for example, p-doped GaN or p-doped AlGaInP. The thickness of the second type semiconductor layer 120 is in a range from 50 nm to 20 µm. The second type semiconductor layer 120 is formed by, for example, epitaxy.

In some embodiments, the active layer 150 is made of, for example, heterostructure or quantum well structure. The thickness of the active layer 150 is in a range from 50 nm to 5 µm. The active layer 150 is formed by, for example, epitaxy.

The first electrodes 140a and the second electrodes 140b are made of a conductive material, such as metal or a transparent conductive material, e.g. indium tin oxide (ITO). The first electrodes 140a and the second electrodes 140b can be formed by, for example, physical vapor deposition (PVD) or chemical vapor deposition (CVD).

In some embodiments, the active layer 150 can be omitted. In the case that the active layer 150 is omitted, the second type semiconductor layer 120 is disposed on the first type semiconductor layer 110.

In some embodiments, the dielectric layer 130 is made of a dielectric material, such as silicon nitride or silicon dioxide. The thickness of the dielectric layer 130 is in a range from 10 nm to 5 µm. The dielectric layer 130 is formed by, for example, physical vapor deposition (PVD).

In addition, a method for manufacturing the micro-LED 100 is provided. With reference made to FIG. 1, the method for manufacturing the micro-LED 100 includes following steps:

Step (1): forming a second type semiconductor layer 120 on or above a first type semiconductor layer 110;

Step (2): forming a dielectric layer 130 on the second type semiconductor layer 120;

Step (3): forming a first opening O1 and a second opening O2 in the dielectric layer 130; and Step (4): forming a first electrode 140a and a second electrode 140b partially on the dielectric layer 130 and electrically coupled with the second type semiconductor layer 120 respectively through the first opening O1 and the second opening O2, in which the first electrode 140a and the second electrode 140b are separated from each other.

Furthermore, the first electrode 140a and the second electrode 140b are formed by such as, but not limited to, photolithography, screen printing, or inkjet printing, and the method further includes forming an active layer 150 between the first semiconductor layer 110 and the second type semiconductor layer 120.

Figure 5:
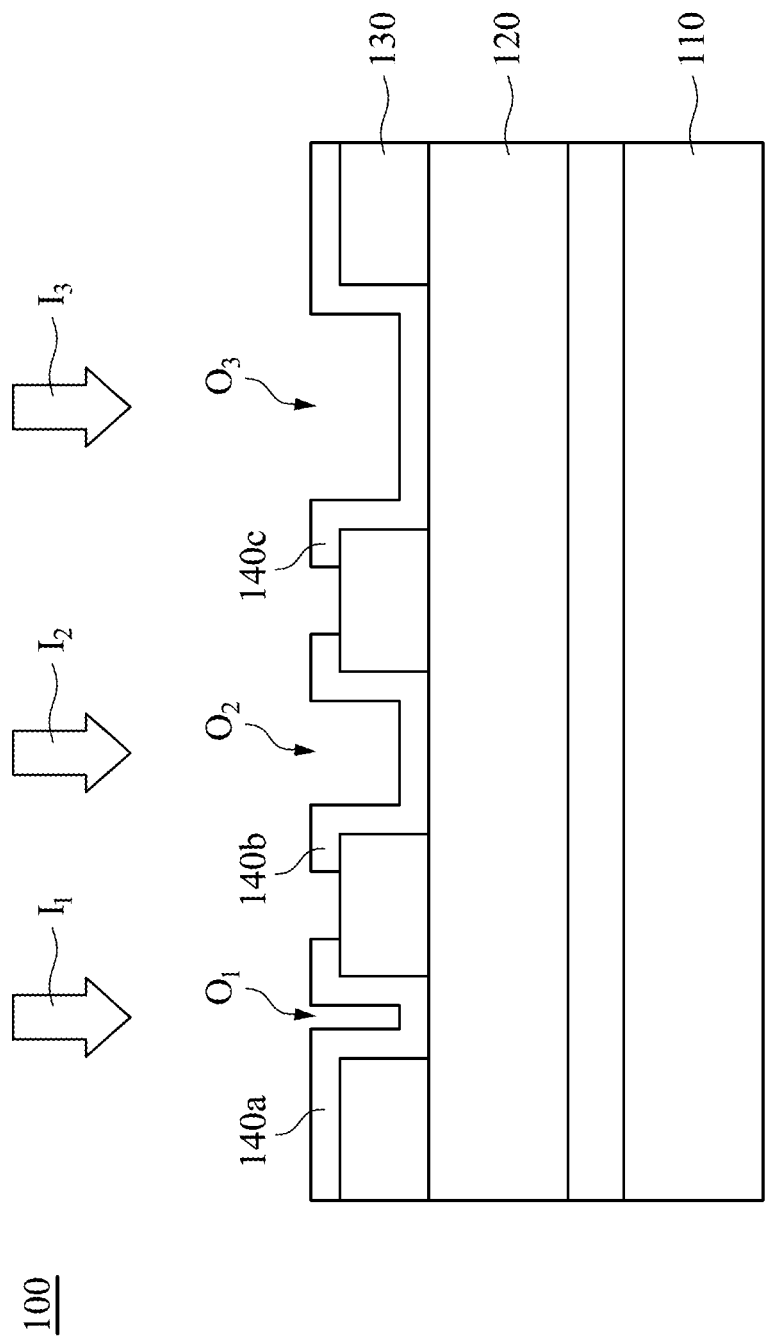
FIG. 5 is a cross-sectional view of a micro-LED according to the second embodiment of this invention.
Figure 6:
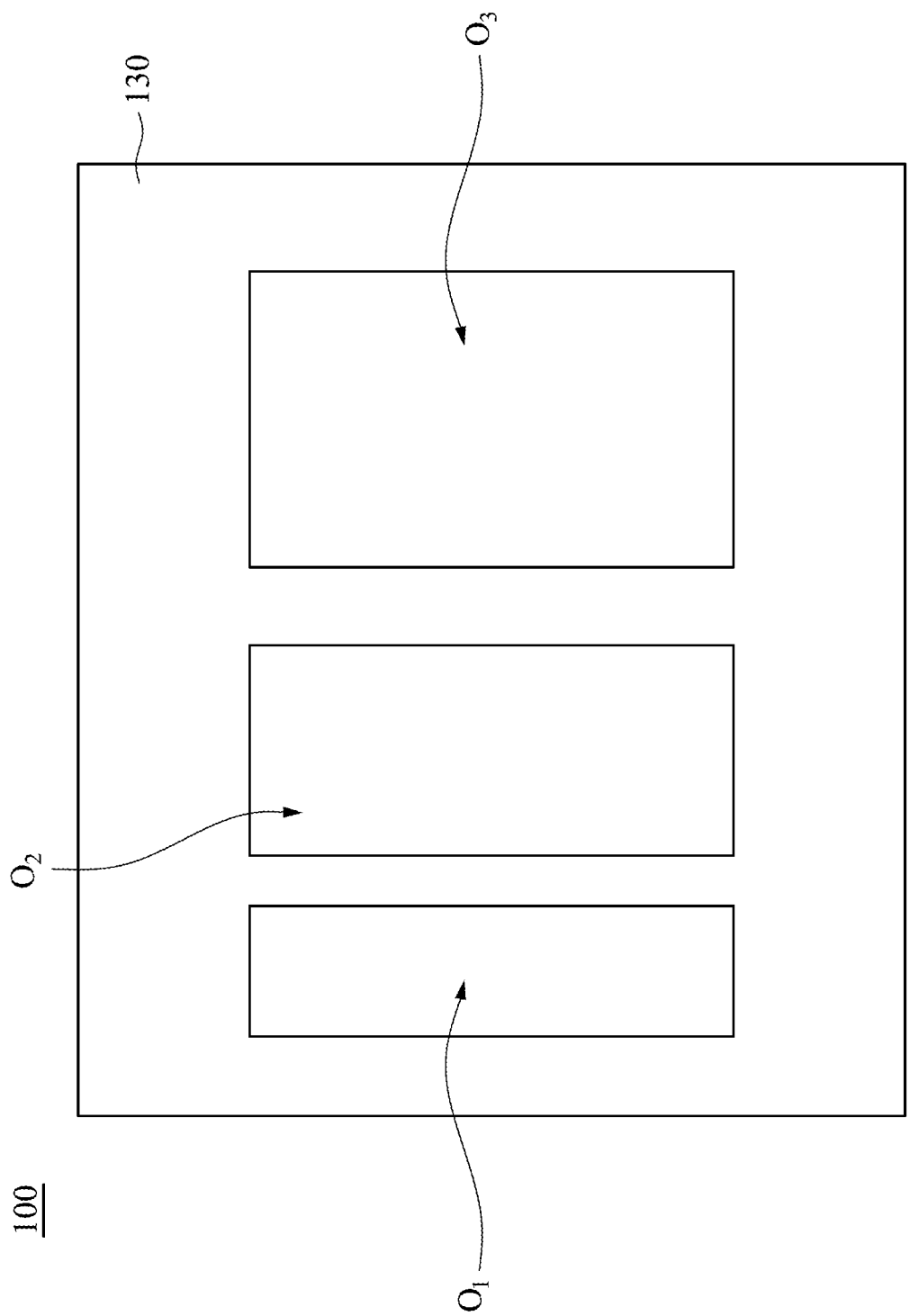
FIG. 6 is a plan view of the micro-LED of FIG. 5, wherein the electrodes are removed.

FIG. 5 is a cross-sectional view of a micro-LED according to the second embodiment of this invention, and FIG. 6 is a plan view of the micro-LED of FIG. 5, wherein the electrodes are removed. The difference between this embodiment and the first embodiment is that the number of the openings of the dielectric layer 130 is added from two to three.

In addition to the first opening O1 and the second opening O2, the dielectric layer 130 has a third opening O3. Therefore, the micro-LED 100 further includes a third electrode 140c, and the third electrode 140c is disposed on the dielectric layer 130 and is electrically coupled with a exposed part of the second type semiconductor layer 120 through the third opening O3. Similarly, the first electrode 140a, the second electrode 140b, and the third electrode 140c are separated from each other.

Other details regarding the micro-LED 100 of FIG. 5 and FIG. 6 are similar to the micro-LED 100 of FIG. 1 and FIG. 3 and therefore are not repeated here to avoid duplicity.

In some embodiments, the range of the brightness of the micro-LED 100 is broadened by adding the numbers of the openings and the electrodes. In this embodiment, the first opening O1 has an area A1, the second opening O2 has an area A2, the third opening O3 has an area A3, and A1<A2<A3. Therefore, In this configuration, when the micro-LED 100 is operated within the linear current density range from J1 to J2 (see FIG. 4), the openings allow current flowing through the micro-LED 100 to be controlled within a continuous current range from A1*J1 to (A1+A2+A3)*J2.

In addition, the openings in this embodiment have the different areas (A1<A2<A3), but are not limited thereto. In some embodiments, a relationship between them is A1≤A2≤A3. That is, the areas A1, A2, and A3 may be arranged in various ways. For example, all the openings of the dielectric layer 130 may have the same area (A1=A2=A3) or have different areas (A1<A2<A3). Furthermore, at least one portion of the openings of the dielectric layer 130 having the same area (A1=A2<A3) is also allowable.

According to the aforementioned configuration, the dielectric layer 130 has three openings, but is not limited thereto. In some embodiments, the number of the openings of the dielectric layer 130 is n, in which the openings respectively have areas A1 to An in order from smallest to largest. When the micro-LED 100 is operated within the linear current density range from J1 to J2, the openings are dimensioned to allow the current flowing through the micro-LED 100 to be controlled within a continuous current range from A1*J1 to (A1+A2+...An)*J2. In addition, the number n is in a range from 2 to 1000 in some embodiments. With the various numbers of the openings, the brightness of the micro-LED 100 can be varied further, and the brightness range also can be broaden.

Furthermore, the electrodes of the micro-LED 100 may be divided into a first group and a second group, and then controlling the potential difference between the electrodes and the first type semiconductor layer 110 is applied further. For example, assuming the numbers of the openings of the dielectric layer 130 and electrodes corresponding to the openings are six hundred, in which the three hundred electrodes belong to the first group and the other three hundred electrodes belong to the second group. Then, the electric potential of the first group of the electrodes is controlled to be V1, the electric potential of the second group of the electrodes is controlled to be V2, the electric potential of the first type semiconductor layer 110 is V3, and V1≠V2=V3 (for example, V1>V2=V3), such that the current flows into the micro-LED 100 through the first group of the electrodes.

Figure 7:
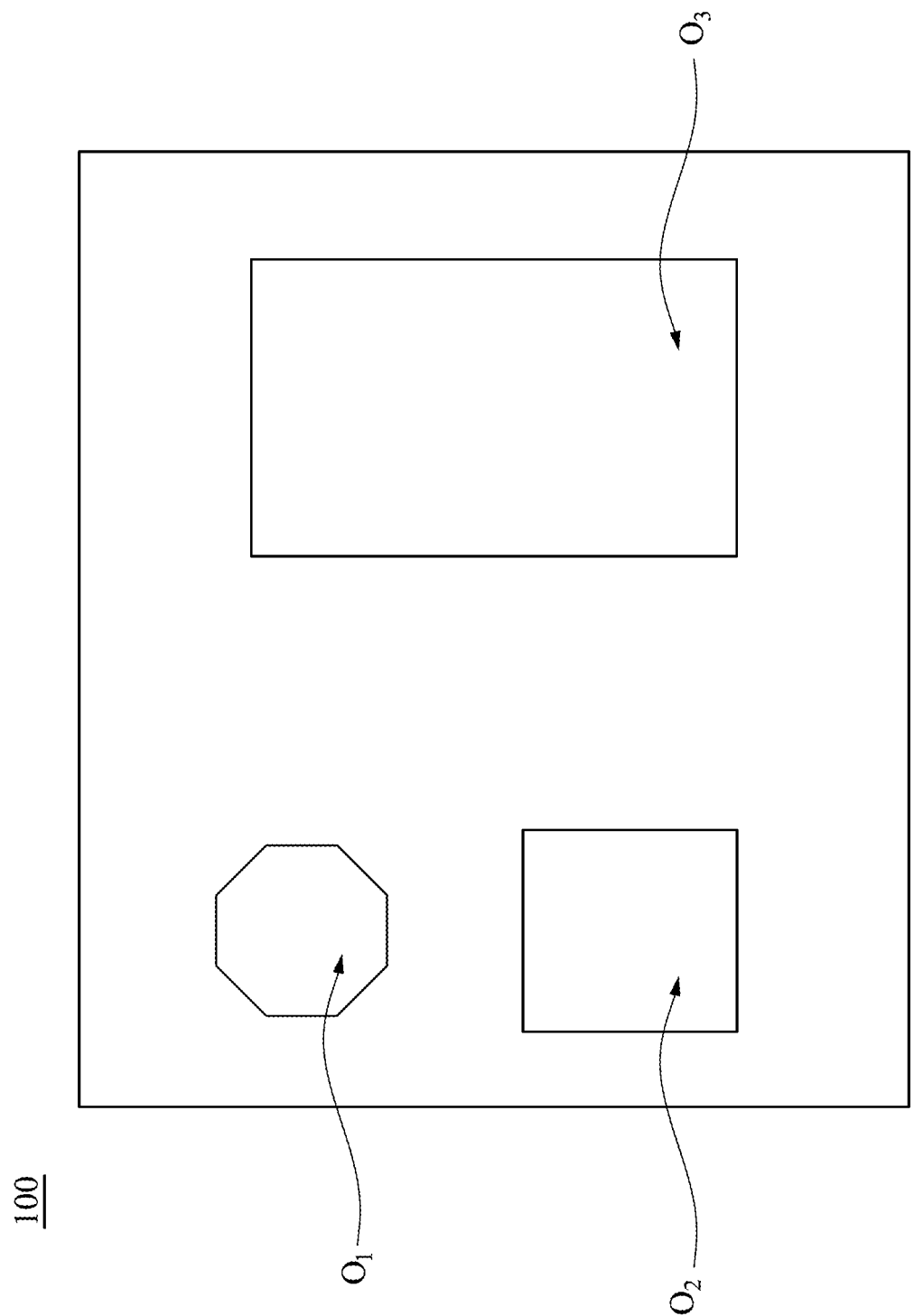
FIG. 7 is a plan view of a micro-LED according to the third embodiment of this invention, wherein the electrodes are removed.

FIG. 7 is a plan view of a micro-LED according to the third embodiment of this invention, wherein the electrodes are removed. The difference between this embodiment and the second embodiment is that the first opening O1 is octagonal with an area A1, the second opening O2 is square with an area A2, and the third opening O3 is rectangular with an area A3, in which the areas A2 and A3 are four times and thirty times bigger than the area A1, respectively. This embodiment demonstrate an arrangement of the openings with coefficient between their areas.

Other details regarding the micro-LED 100 of FIG. 7 are similar to the micro-LED 100 of FIG. 1 and therefore are not repeated here to avoid duplicity.

Furthermore, the micro-LED 100 is operated within the linear current density range from J1 to J2 (see FIG. 4), in which the current density J2 is ten times greater than the current density J1. For making the description succinct, the sizes of the area A1, A2, and A3 are marked as A, 4A, and 30A, respectively, and the current density J1 and J2 are marked as J and 10J.

Therefore, for the first opening O1, current flowing into the micro-LED 100 through the first opening O1 is in a range from A*J to A*10J. For the second opening O2, current flowing into the micro-LED 100 through the second opening O2 is in a range from 4A*J to 4A*10J. For the third opening O3, current flowing into the micro-LED 100 through the third opening O3 is in a range from 30A*J to 30A*10J.

Moreover, since the brightness of light outputted through the first opening O1 is proportional to the current flowing through the first opening O1, the brightness of the first opening O1 is marked in a range from B to 10B. Similarly, the brightness of the second opening O2 is marked in a range from 4B to 40B, and the brightness of the third opening O3 is marked in a range from 30B to 300B.

Since the electrodes are controlled individually, the lowest brightness of the micro-LED 100 is B when the current only flows through the first opening O1 with the low current density J1. Relatively, the highest brightness of the micro-LED 100 is occurred when the current simultaneously flows through all the openings, including the first opening O1, the second opening O2, and the third opening O3 with the high current density J2, and hence the highest brightness of the micro-LED 100 superposed by the respective highest brightness of the first opening O1, the second opening O2, and the third opening O3 is 350B (10B+40B+300B). Therefore, the brightness of the micro-LED 100 is in a range from B to 350B.

In addition to controlling the current density, the plural openings of the micro-LED 100 allow the brightness range to be broader such that the highest bright is extended thirty-five times from 10B (only the first opening O1) to 350B. However, the exact brightness of the micro-LED 100 is determined by the current, which is the product of the total area of the openings and the current density, and the range from B to 350B is a proportional relationship.

Figure 8:
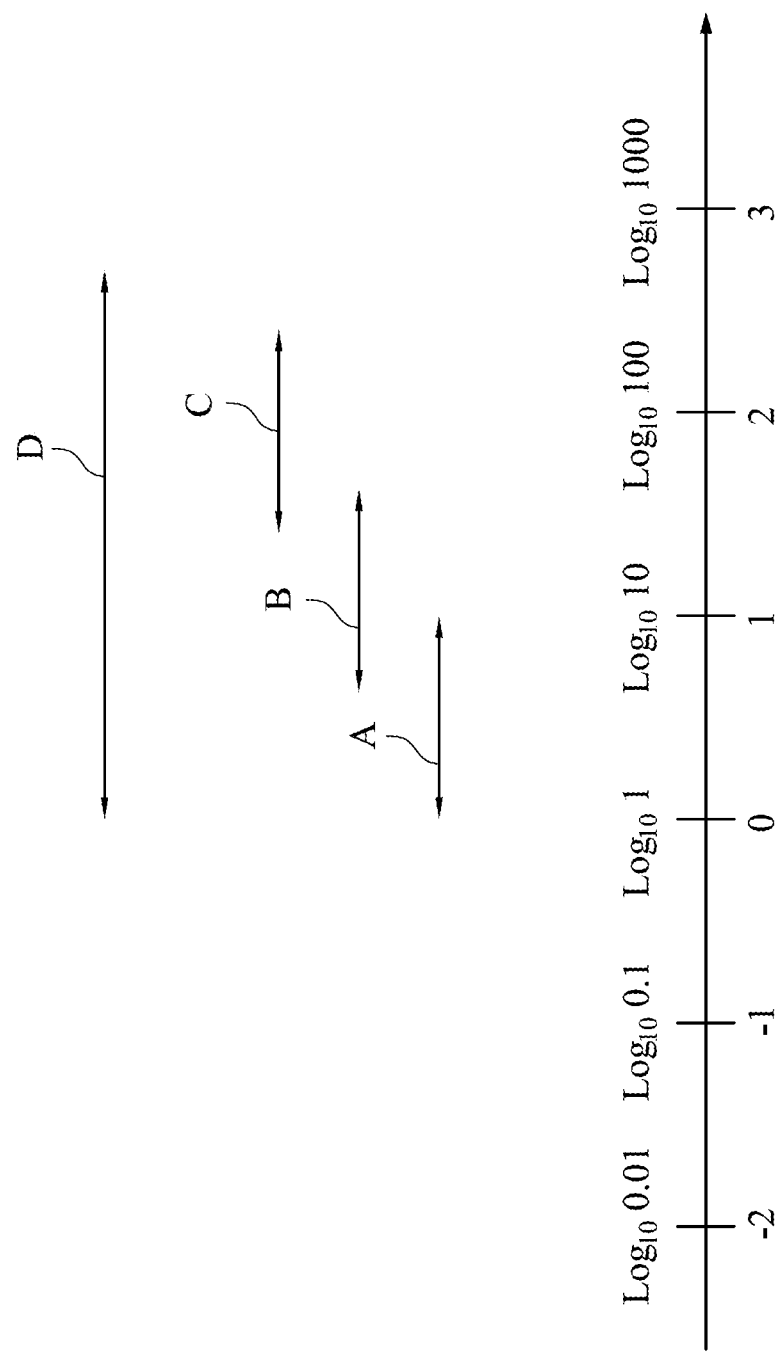
FIG. 8 is a dynamic-brightness range of the micro-LED of FIG. 7.

FIG. 8 is a dynamic-brightness range of the micro-LED of FIG. 7. As shown in FIG. 7 and FIG. 8, the proportional relationship of the brightness of the first opening O1, the second opening O2, and the third opening O3 is converted to logarithmic scale.

For the first opening O1, the brightness is converted to in a range from log 1 to log 10 (0 to 1), and the range is marked as the range A in FIG. 8. For the second opening O2, the brightness is converted to in a range from log 4 to log 40 (approximately 0.6 to 1.6), and the range is marked as the range B in FIG. 8. For the third opening O3, the brightness is converted to in a range from log 30 to log 300 (approximately 1.48 to 2.48), and the range is marked as the range C in FIG. 8. In addition, the brightness of the micro-LED 100 is converted to in a range from log 1 to log 350 (approximately 0 to 2.544), and the range is marked as the range D in FIG. 8.

Similarly, since the adjacent ranges, range A and range B or range B and range C, are overlapped, the range D superposed by the brightness of the first opening O1, the second opening O2, and the third opening O3 is continuous.

In simple terms, the brightness corresponding to range D is determined by the number of the openings with current flowing through and the current density in the range from J1 to J2. In some embodiments, the lowest current density is in a range form 0.1 A/cm$^2$ to 1 A/cm$^2$ and the highest current density is in a range from 10 A/cm$^2$ to 100 A/cm$^2$. However, a person having ordinary skill in the art may choose a proper current density range. For the current density range, setting the lowest current density may allow the micro-LED 100 to be operated within the linear current density range, and setting the highest current density may prevent the micro-LED 100 from the current being too strong. Moreover, too strong current may cause lifetime and efficiency of the micro-LED 100 decrease.

In summary, since the electrodes of the micro-LED 100 are separated from each other, the number of the openings with current flowing through is decided by the number of the electrodes applied with electric potential that is different from the first semiconductor layer (see FIG. 1). Therefore, current in amperes of the micro-LED 100 can be calculated by determining the product of the current density and the total area of the openings with current flowing, and hence the current flowing through the micro-LED 100 is controllable and variable.

That is, the micro-LED 100 is allowed to emit light with the brightness that is proportional to the current flowing through the micro-LED 100 such that the brightness with the range D of the micro-LED 100 is also controllable and variable, and hence the range D is a dynamic-brightness range. For example, assuming the area A is 25 μm$^2$, the area B is 100 μm$^2$, the area C is 750 μm$^2$, and the current density is in a range from 1 A/cm$^2$ to 10 A/cm$^2$, the current flowing through the micro-LED 100 is in a range from the lowest current 25*10$^{-6}$ A to the highest current 8750*10$^{-6}$ A, and the brightness of the micro-LED 100 that is controllable and variable is proportional to this range.

Figure 9:
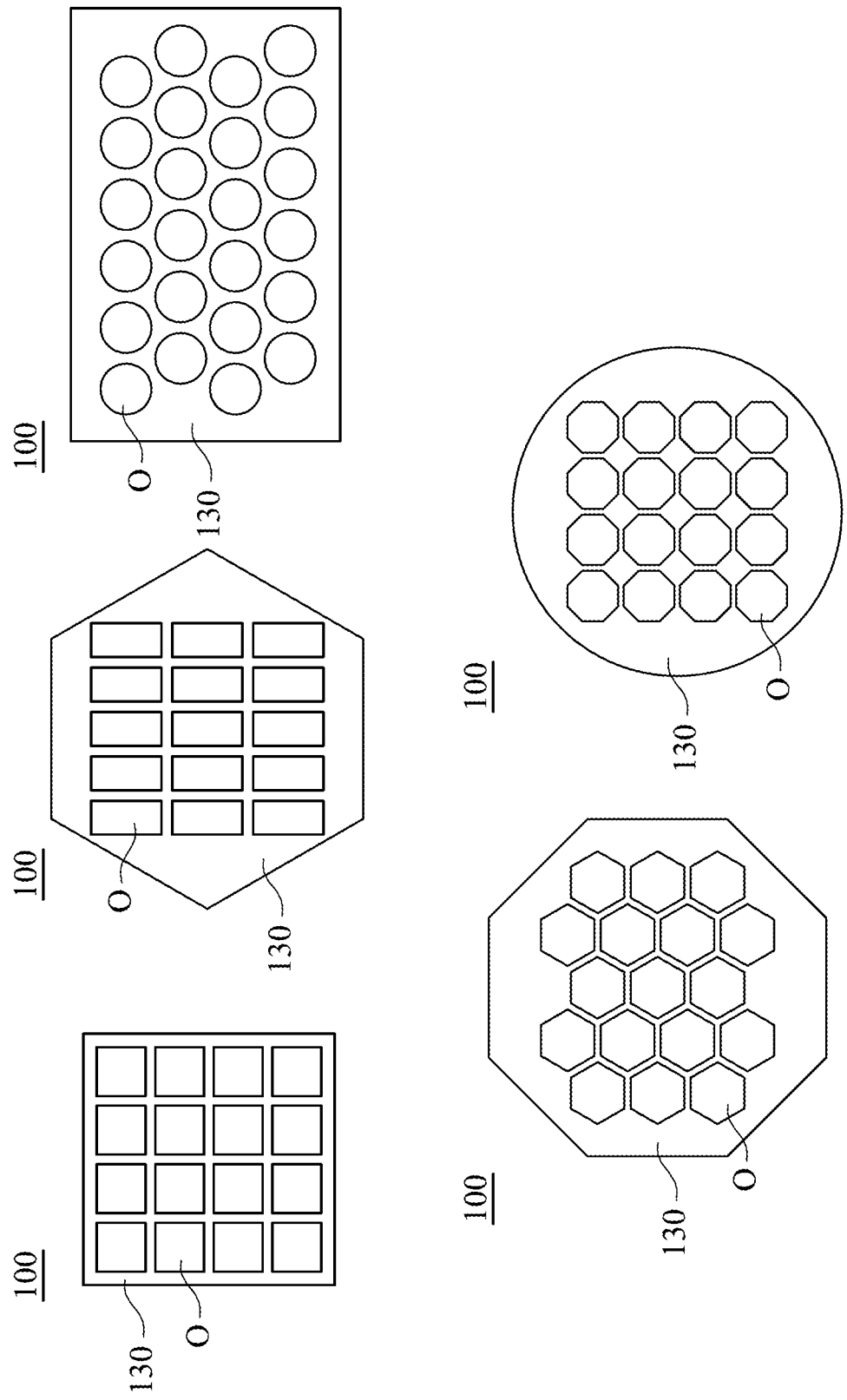
FIG. 9 is a plan view of a plurality of micro-LEDs according to the fourth embodiment of this invention, wherein the electrodes are removed.

FIG. 9 is a plan view of a plurality of micro-LEDs according to the fourth embodiment of this invention, wherein the electrodes are removed. As shown in FIG. 9, the dielectric layer 130 has a plurality of openings O therein. The number of the openings O is in a range from 2 to 1000. The openings O are arranged in an array, and all the openings O have the same shape. More specifically, the openings O of the dielectric layer 130 viewed in a direction normal to the dielectric layer 130 are circular, square, rectangular, octagonal, or polygonal.

On the other hand, the micro-LED 100 viewed in a direction normal to the dielectric layer 130 is circular, square, rectangular, octagonal, or polygonal, in which the shape of the micro-LED 100 viewed in a direction normal to the dielectric layer 130 is independent of the shape of the openings O. Therefore, the micro-LED 100 and the openings O may have the same shape or the different shapes.

Other details regarding the micro-LED 100 of FIG. 9 are similar to the micro-LED 100 of FIG. 1 and therefore are not repeated here to avoid duplicity.

Figure 10:
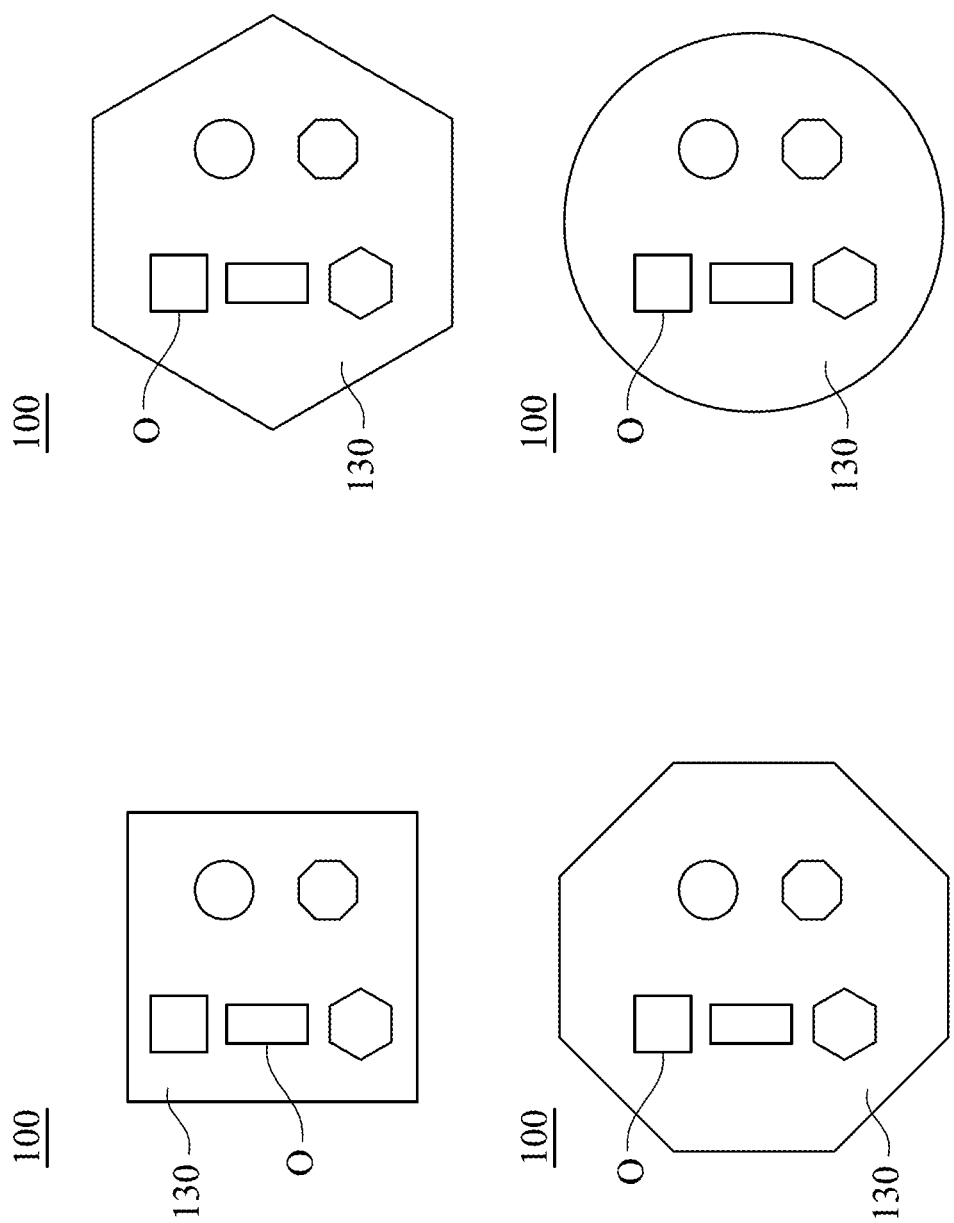
FIG. 10 is a plan view of a plurality of micro-LEDs according to the fifth embodiment of this invention, wherein the electrodes are removed.

FIG. 10 is a plan view of a plurality of micro-LEDs according to the fifth embodiment of this invention, wherein the electrodes are removed. The difference between the micro-LED 100 of FIG. 10 and the micro-LED 100 of FIG. 9 is that all the openings O of the dielectric layer 130 have different shapes. Similarly, the shape of the micro-LED 100 is independent of the shape of the openings O.

Other details regarding the micro-LED 100 of FIG. 10 are similar to the micro-LED 100 of FIG. 1 and therefore are not repeated here to avoid duplicity.

Figure 11:
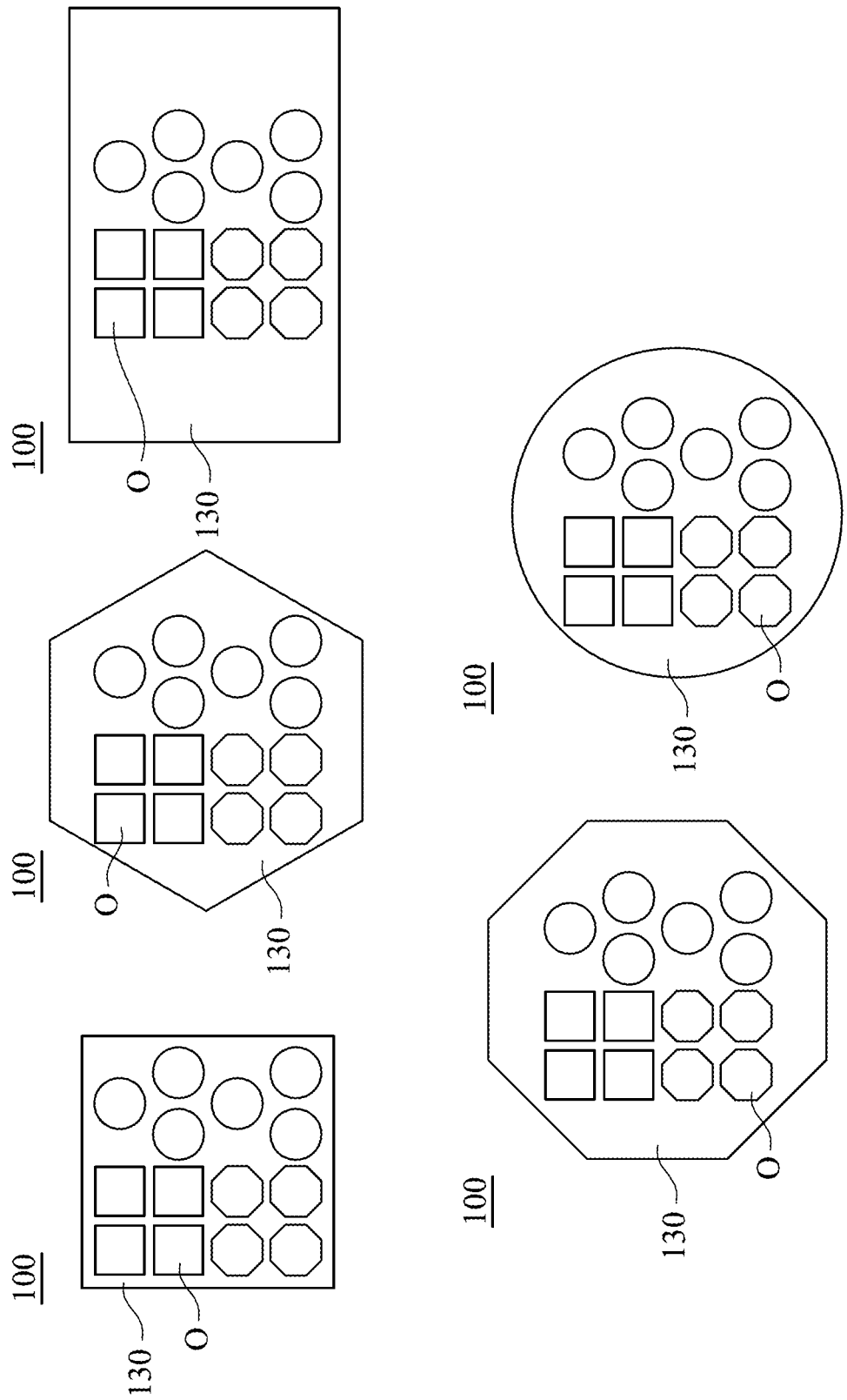
FIG. 11 is a plan view of a plurality of micro-LEDs according to the sixth embodiment of this invention, wherein the electrodes are removed.

FIG. 11 is a plan view of a plurality of micro-LEDs according to the sixth embodiment of this invention, wherein the electrodes are removed. The difference between the micro-LED 100 of FIG. 11 and the micro-LED 100 of FIG. 9 is that at least one portion of the openings O of the dielectric layer 130 have the same shape. For example, the openings O are divided three parts, one portion of the openings is circular, another portion of the openings is square, and the other portion is octagonal. Similarly, the shape of the micro-LED 100 is independent of the shape of the openings O.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A method for operating a micro-LED, comprising:
    individually controlling electric potential of a plurality of electrodes of the micro-LED, wherein the micro-LED comprises:
        a first type semiconductor layer;
        a second type semiconductor layer disposed or above the first type semiconductor layer; and
        a dielectric layer disposed on the second type semiconductor layer and the dielectric layer having a plurality of openings therein to expose a plurality of parts of the second type semiconductor layer, wherein the electrodes partially are disposed on the dielectric layer and respectively directly electrically coupled with the exposed parts of the second type semiconductor layer through the openings of the dielectric layer, wherein the electrodes are separated from each other,
    wherein the electric potential of at least one of the electrodes is controlled to be V1, the electric potential of the other electrodes is controlled to be V2, and V1≠V2.

2. A method for operating a micro-LED, comprising:
    individually controlling electric potential of a plurality of electrodes of the micro-LED, wherein the micro-LED comprises:
        a first type semiconductor layer;
        a second type semiconductor layer disposed on or above the first type semiconductor layer; and
        a dielectric layer disposed on the second type semiconductor layer and the dielectric layer having a plurality of openings therein to expose a plurality of parts of the second type semiconductor layer, wherein the electrodes partially are disposed on the dielectric layer and respectively directly electrically coupled with the exposed parts of the second type semiconductor layer through the openings of the dielectric layer, wherein the electrodes are separated from each other,
    wherein the electric potential of a first group of the electrodes is controlled to be V1, the electric potential of a second group of the electrodes is controlled to be V2, and V1≠V2.

3. The method of claim 1, wherein the openings respectively have areas A1 to An in order from smallest to largest, the micro-LED is operated within a linear current density range from J1 to J2, and the openings are dimensioned to allow a current flowing through the micro-LED to be controlled within a continuous current range from A1*J1 to (A1+A2+ . . . An)*J2.

4. The method of claim 1, wherein the openings respectively have areas A1 to An in order from smallest to largest, the micro-LED is operated within a current density range from J1 to J2, and a current flowing through the micro-LED is controlled to have a minimum A1*J1 and a maximum (A1+A2+ . . . An)*J2.

5. The method of claim 2, wherein the openings respectively have areas A1 to An in order from smallest to largest, the micro-LED is operated within a linear current density range from J1 to J2, and the openings are dimensioned to allow a current flowing through the micro-LED to be controlled within a continuous current range from A1*J1 to (A1+A2+ . . . An)*J2.

6. The method of claim 2, wherein the openings respectively have areas A1 to An in order from smallest to largest, the micro-LED is operated within a current density range from J1 to J2, and a current flowing through the micro-LED is controlled to have a minimum A1*J1 and a maximum (A1+A2+ . . . An)*J2.

* * * * *